(12) United States Patent
Prymak

(10) Patent No.: US 6,903,920 B1
(45) Date of Patent: Jun. 7, 2005

(54) CLIP-ON LEADFRAME FOR LARGE CERAMIC SMD

(75) Inventor: John D. Prymak, Greer, SC (US)

(73) Assignee: Kemet Electronics, Greenville, SC (US)

(*) Notice: Subject to any disclaimer, the term of this patent is extended or adjusted under 35 U.S.C. 154(b) by 0 days.

(21) Appl. No.: 10/913,767

(22) Filed: Aug. 6, 2004

(51) Int. Cl.[7] ............................................. H01G 4/06
(52) U.S. Cl. .......................... 361/321.2; 301/321.1; 301/306.1; 301/306.3; 301/311; 301/313
(58) Field of Search ..................... 361/321.2, 321.1, 361/321.5, 301.4, 306.1, 306.3, 308.1, 310, 311, 313, 320, 322, 328

(56) References Cited

U.S. PATENT DOCUMENTS

| | | | | |
|---|---|---|---|---|
| 5,805,409 A | * | 9/1998 | Takahara et al. | 361/303 |
| 5,812,363 A | * | 9/1998 | Kuroda et al. | 361/306.3 |
| 6,205,015 B1 | * | 3/2001 | Wada et al. | 361/321.4 |
| 6,380,619 B2 | * | 4/2002 | Ahiko et al. | 257/703 |
| 6,381,118 B1 | * | 4/2002 | Yokoyama et al. | 361/308.1 |
| 6,556,423 B2 | * | 4/2003 | Konaka et al. | 361/321.2 |

* cited by examiner

Primary Examiner—Dean A. Reichard
Assistant Examiner—Nguyen T. Ha
(74) Attorney, Agent, or Firm—J. Herbert O'Toole; Nexsen Pruet, LLC

(57) ABSTRACT

A ceramic capacitor with a low-profile leadframe. The ceramic capacitor comprises a multiplicity of parallel plates in planar relationship. Each plate terminates at opposing faces in an alternating pattern. A dielectric is between the parallel plates. Two external terminations are on opposing sides of the capacitor wherein each external termination is in electrical contact with alternating plates of the multiplicity of parallel plates. The bottom half of the ceramic capacitor including the external terminations is treated with an insulative coating prior to attachment to a leadframe. The noninsulated portions of the terminations are attached to the leadframe and the insulator prevents the leadframe from attaching to the lower vertical faces of the terminations. The leadframe in this manner creates no excessive distance between the chip and the PCB surface, thus reducing inductance and resistance.

8 Claims, 8 Drawing Sheets (Prior Art)

CLIP-ON LEADFRAME FOR LARGE CERAMIC SMD

FIELD OF THE INVENTION

The present invention is related to large ceramic chips (larger than 0805) and structures and methods to eliminate the susceptibility to flex or mechanical cracking.

BACKGROUND OF THE INVENTION

Capacitors, particularly interdigitated capacitors, are well known in the art of electrical components. Capacitors typically comprise parallel plates, which act as anodes and cathodes, with a dielectric there between. The function of capacitors is well known and further discussion is not warranted herein.

Capacitors are typically secured to a substrate as a component to a printed circuit board (PCB). This arrangement, while long utilized in the art, is now a limiting factor in the further ongoing expansion of ceramic capacitor applications requiring larger capacitance, and larger chips. The major limitation is the propensity for ceramic capacitors to form cracks, and therefore, fail when subjected to flex stresses.

It is well known that stress cracking is exacerbated in larger capacitors. As the size of a capacitor increases the separation distance between the external electrodes, or terminations, increases. Any flex in the substrate is therefore amplified relative to a small capacitor with close termination leads. One widely known method for preventing stress fractures is to utilize lead frames, as illustrated in FIG. 4, which elevates and isolates the capacitor above the substrate. The lead frame dissipates stress thereby protecting the capacitor. This method has been widely used in the past yet the length of the lead frame is antithetical to ongoing efforts to reduce inductance and resistance, thereby rendering this method inapposite for modem circuits with increased demands for lower inductance and resistance. Reducing the separation between the capacitor and substrate has been considered impossible due to problems associated with solder flowing upward and causing elimination of the mechanical independence of the leadframe system. This extended offset above the board allows for absorption of mechanical stress, but also creates mechanical instability to shock and vibration as the center of gravity is elevated in the same manner.

There remains a need for a novel capacitor presentation, which greatly decreases the propensity for stress fractures from flexing, by utilizing a unique leadframe attachment method. Such a novel capacitor can achieve the elimination of flex cracks while still maintaining the desired ceramic capacitor performance and especially the higher capacitance capabilities in larger chips.

SUMMARY OF THE INVENTION

It is an object of the present invention to provide a capacitor that is not susceptible to stress fractures and solves the problems posed by the leadframe attachment method of the aforementioned prior art while having added dimensional and mechanical stability.

The ceramic capacitor comprises a multiplicity of parallel plates in planar relationship. Each plate terminates at an opposing face in an alternating pattern. A dielectric is between the parallel plates. Two external terminations are on opposing sides of the capacitor wherein a first external termination is in electrical contact with alternating plates of the multiplicity of parallel plates and a second external termination is in electrical contact with separate alternating plates than the first external termination. An insulative film is applied to the bottom half of the capacitor chip and covers a portion of the two external terminations. A first low-profile leadframe is attached to and in electrical contact with the first external termination at a location void of the insulative coating. Further, a second low-profile leadframe is attached and in electrical contact with the second external termination at a location void of the insulator. Both low-profile leadframes comprise an unencumbered vertical rise and a base, which may be soldered to a printed circuit board (PCB).

The insulative film is applied on the bottom half of the ceramic chip to prevents the base of the leadframe from becoming attached to the capacitor chip, or the capacitor's termination to the solder pad. The insulative film further allows for an unencumbered vertical height for the leadframe and allows for lateral movement in a plane parallel to the plane of the PCB.

A particular feature of the present invention is the ability to secure the leadframe to the capacitor in such a manner that the offset of the center of gravity between a capacitor chip directly mounted to the board and center of gravity of the offset chip of this invention is slightly greater than the thickness of the foot of the leadframe.

A method for the unique preparation of the capacitors end terminations prior to and including the attachment of the leadframe is provided comprising the steps of:

a) dipping the chip into a liquid bath of material that will create a dry insulative coating over the contact area when dried;

b) forming the leadframe to fit or clip on the end termination; and c) attaching the leadframe to the end terminations by means of conductive epoxy or high temperature solder, with the attachment concentrated over the uncoated or upper half of the chip's termination.

DETAILED DESCRIPTION OF THE DRAWINGS AND INVENTION

The invention will be described with reference to the drawings which form an integral part of the disclosure. In the various drawings, similar elements will be numbered accordingly.

Figure 1:
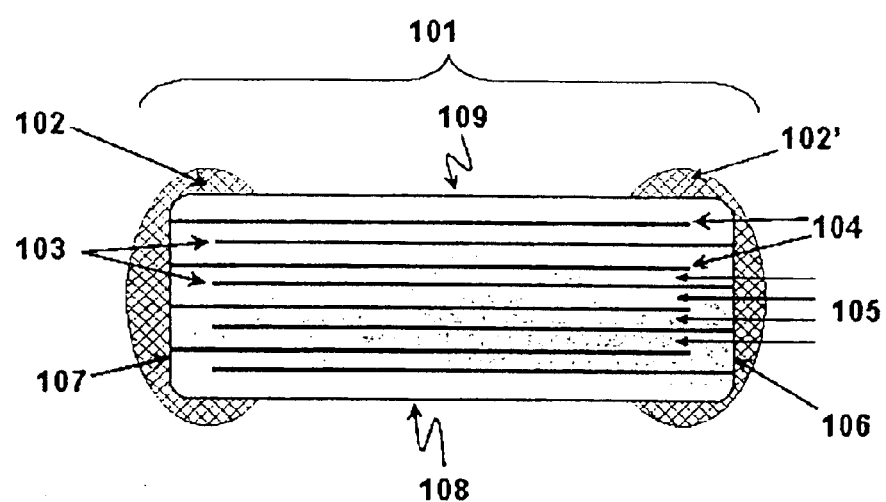
FIG. 1 is a cross-sectional view of a capacitor chip.

The configuration of ceramic multilayer capacitors is well known in the art. FIG. 1 is a cross-sectional view of an exemplary structure of a multilayer ceramic capacitor chip, 101. The shape of the capacitor chip, 101, is not critical although it is often rectangular shaped. Also, the size is not critical and the chip may have appropriate dimensions in accordance with a particular application, typically in the range of 1.0 to 10 mm in length by 0.5 to 10 mm in width and 0.5 to 2.0 mm in height.

The capacitor chip, 101, has a plurality of alternately stacked internal electrode layers, also known as plates, 103 and 104. In FIG. 1, the capacitor chip, 101, is non-polar because the plates are oppositely charged, positive and negative, but can be charged in either direction. Dielectric layers, 105, separate the internal electrode layers, 103 and 104. Further, the internal electrode layers, 103 and 104, are stacked so that internal electrode layers, 103, of one group are exposed at one side surface, 106, of the capacitor chip, 101, while internal electrode layers, 104, of another group are exposed at the opposite side surface, 107, of the capacitor chip, 101. The capacitor chip, 101, also has external electrodes, also known as terminations, 102 and 102'. One external electrode, 102, is applied to one side surface, 107, of the capacitor chip, 101, so that it is in electrical contact with one group of internal electrode layers, 104, of the capacitor chip, 101. Likewise, the other external electrode, 102', is applied to the opposite side surface, 106, of the capacitor chip, 101, so that it is in electrical contact with the other group of internal electrode layers, 103, of the capacitor chip, 101. The plate arrangement is usually with adjacent internal electrode layers, 103 and 104, terminating to opposite face terminations, 102 and 102', and non-adjacent internal electrode layers, 103 and 104, terminating to the same side surface, 106 or 107, respectively. Further, the internal electrode layers or plates, 103 and 104, are offset in such a manner that they extend to the side surfaces, 106 and 107, of the capacitor chip, 101, but only at the external electrodes or terminations, 102 and 102'; otherwise, they are encased and insulated from all other faces by ceramic material. A top face, 109, and bottom face, 108, of the capacitor chip, 101, are designated here by convention, but in reality, these orientations are defined when the chip is mounted to the PCB. The terminations, 102 and 102', wrap onto the bottom face, 108, which is in closest contact to solder pads on the PCB. A desired capacitor circuit is completed in this way.

The terminations, 102 and 102', are metalizations and are applied to the ceramic of the capacitor chip, 101, using a termination dip. The terminations, 102 and 102', are applied as metallic particles suspended in slurry with a glass frit. The terminations, 102 and 102', are fired on the side surfaces, 106 and 107, of the ceramic capacitor chip, 101, with the glass frit acting as a bonding agent between the metal particles and the ceramic body.

Figure 2:
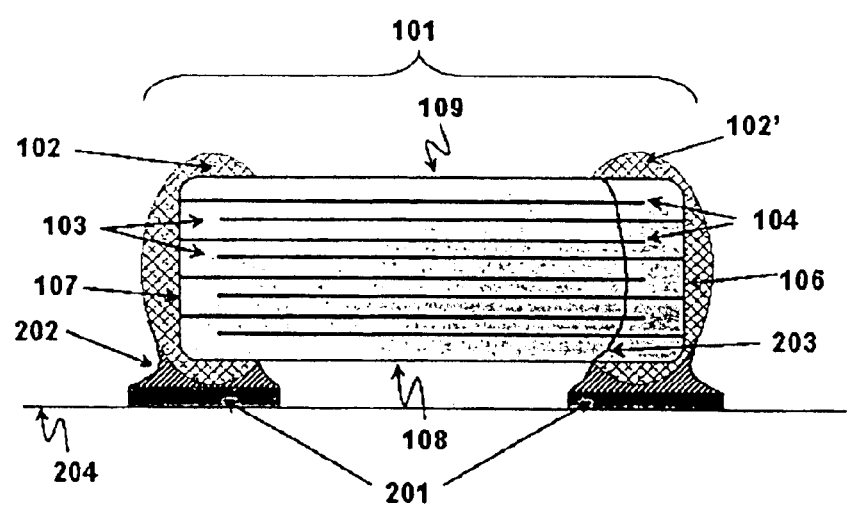
FIG. 2 is a cross-sectional view of a capacitor chip solder mounted to a printed circuit board (PCB) and showing the location of a typical flex crack.

FIG. 2 shows a cross-sectional view of a ceramic capacitor chip, 101, solder mounted to a PCB, 204. The solder connection, 202, creates an electrically conductive and mechanical bond between solder pads, 201, and the end terminations, 102 and 102', of the capacitor chip, 101. It is at this point that the top face, 109, and bottom face, 108, of the chip are defined because these are in relation to the PCB, 204. A flex crack is shown, 203, in the right side of the capacitor, 101, starting in the bottom face, 108, at the point where the bottom wrap of the end termination, 102', ends along the bottom face, 108. It is shown as rising into the electrodes, 103 and 104, then upward into the top face, 109, of the capacitor, 101. The distinguishing fact with ceramic capacitor chip cracks is that the cracks always start in the bottom face, 108, at the end of the termination, 102 or 102'. It can stop in the internal electrodes, 103 or 104, turn into the side surface, 106 or 107, or as indicated, rise vertically upwards. Cracks are created when the PCB, 204, is bent and the distance between the termination pads, 201, on the PCB, 204, increases. With this distance increasing, the board applies a sheer force to the ceramic between the terminations, 102 and 102', and the crack starts at the point where the ceramic becomes unsupported by the termination, 102 or 102', on the bottom face, 108, of the capacitor chip, 101. Although the crack is illustrated as involving termination 102', it can appear in either termination, 102 or 102'.

Figure 3:
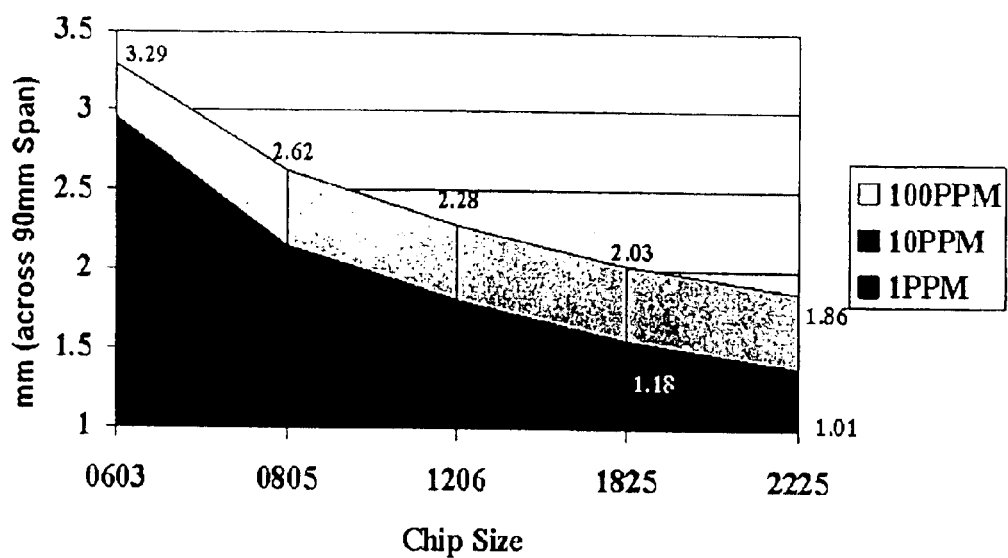
FIG. 3 is a plot of the susceptibility of ceramic capacitor chips to flex cracks as a function of the size of the chip

FIG. 3 is a graphical presentation of flex crack susceptibility versus chip size. Three levels of failure are plotted to indicate the flexure required to achieve 100-PPM, 10-PPM, and 1-PPM failure rates. As the chip size (using EIA designations) increases to the right of the plot, the flexure required to achieve these failure rates is decreasing. The larger the chip size (i.e., larger EIA number), the greater the susceptibility to flex crack failure.

Figure 4:
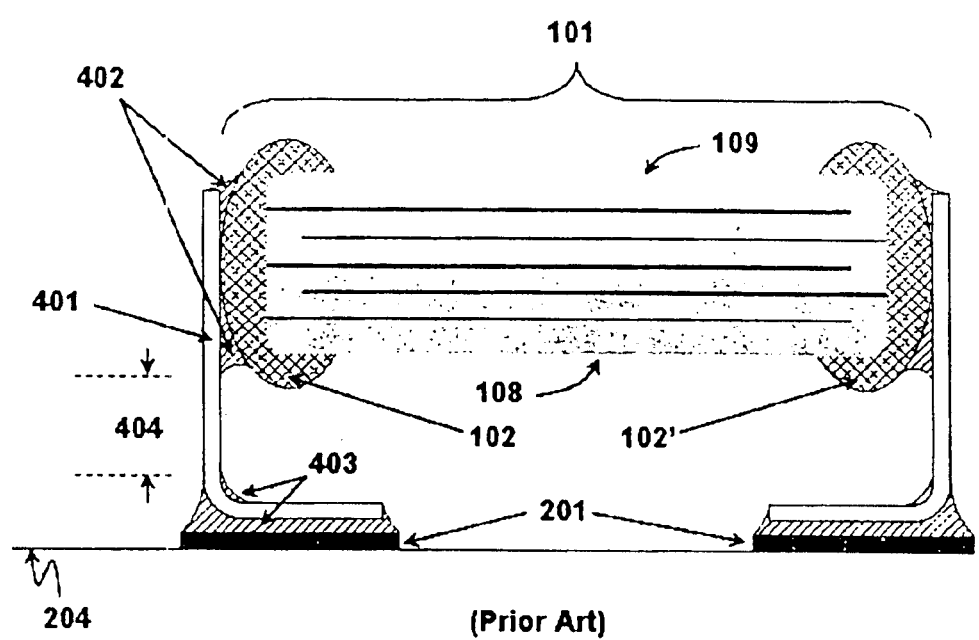
FIG. 4 is cross-sectional view of a ceramic capacitor chip with leadframes attached prior to mounting to the PCB as disclosed in the prior art.

FIG. 4 illustrates a cross-sectional view of a ceramic capacitor chip, 101, mounted to pads, 201, on a PCB, 204, using a leadframe, 401. The leadframe, 401, is typically a copper, copper alloy, or nickel based material that is often plated with nickel (except when the leadframe is a nickel based material), tin, solder, or gold. The leadframe, 401, helps eliminate the mechanical constraints of direct chip mount as described above. The ceramic chip, 101, is typically first attached to the leadframe, 401, using a solder, 402, or conductive adhesive. The leadframe, 401, is then soldered, 403, to the solder pads, 201, on the PCB, 204. If solder is used in attaching the leadframe, 401, to the capacitor chip, 101, the solder, 402, is usually a high temperature solder, such as 95% Sn-5% Pb MP 224° C. solder or 96.5% Sn-3.5% Ag MP 221° C. solder. A high temperature solder, 402, assures that the leadframe, 201, remains attached to the capacitor chip, 101, during the reflow temperatures encountered when the leadframe, 201, is attached to the PCB surface, 205. Those in the art will recognize that alternative solders for attaching the leadframe, 201, to the capacitor chip, 101, could be used to eliminate the use of lead-based solder.

The leadframe arrangement works only if there is some free vertical length, 404, of the leadframe, 401, which allows the ceramic capacitor, 101, to have some mechanical freedom from the PCB, 204. If the solder, 403, at the solder pads, 201, were allowed to creep up the leadframe, 401, and establish a bridged contact to the lower portions of the end terminations, 102 and 102', then the free movement of the leadframe is diminished. In order to assure that this bridging cannot occur, the extension of the leadframe above the PCB, 204, must be large enough to eliminate this possibility.

By utilizing the leadframe, 401, the movement of the solder pads, 201, on the face of the PCB, 204, is isolated by the mechanical flexure of the leadframe, 401, and no sheer forces are transmitted to the suspended capacitor chip, 101. However, because the capacitor chip, 101, now has this leadframe, 401, extending from the bottom face, 108, of the ceramic capacitor, 101, there are four detrimental impacts to this solution:

a) the fragility of the leadframe, 401, extending below the bottom face, 108, of the capacitor chip, 101, usually requires that elaborate fixtures be created to hold the leadframe, 401, and the chip, 101, in alignment during the attachment of the leadframe to the capacitor;

b) the center of mass of the capacitor chip, 101, is elevated well above the PCB, 204, which creates susceptibility to movement during mild shock and vibration;

c) the additional length, 404, of leadframe, 401, adds to the resistive and inductive parasitics of the capacitor, 101, degrading electrical performance; and, d) the additional length of the leadframe, separation distance, 404, adds thermal resistance to the heat dissipative path from the ceramic capacitor chip, 101, creating a greater temperature rise in the capacitor for a given power dissipation.

Figure 5:
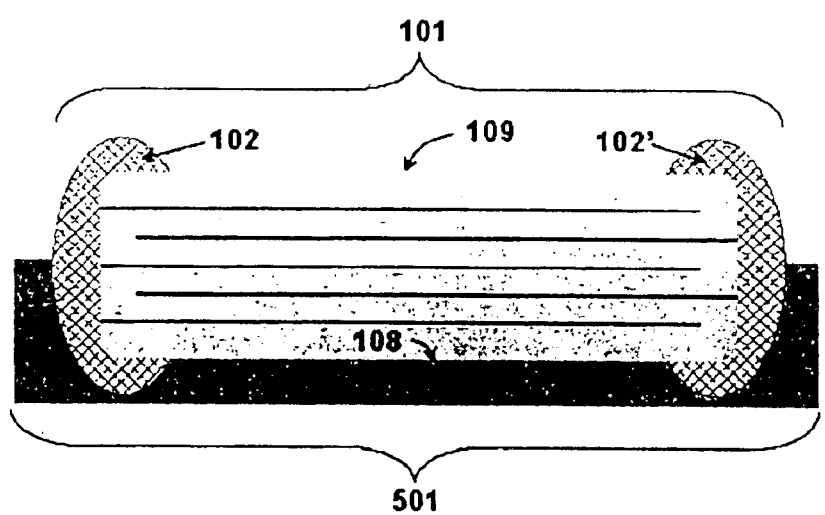
FIG. 5 is a cross-sectional view of a capacitor chip immersed to half of its height in a fluid bath.

FIG. 5 is a cross-sectional view of the ceramic capacitor chip, 101, resting in a fluidized bed, 501. The capacitor chip, 101, is immersed into the fluid, 501, approximately half of the height of the capacitor chip, 101, to allow the fluid to coat the bottom half of the capacitor chip, 101. This fluid may be an epoxy, or a suspended or low-fire glass, but must create an electrically insulative film upon drying. The insulative film is preferably a nonmetal so that it non-solderable and can resist rewetting by the solder. It is also important that the insulative film material be able to withstand the temperatures involved in the solder reflow processes. The capacitor chip, 101, could be immersed into an existing bath and then extracted, or the fluid could be filled or emptied as the capacitor chip, 101, sits in the fluid, 501, container.

Figure 6:
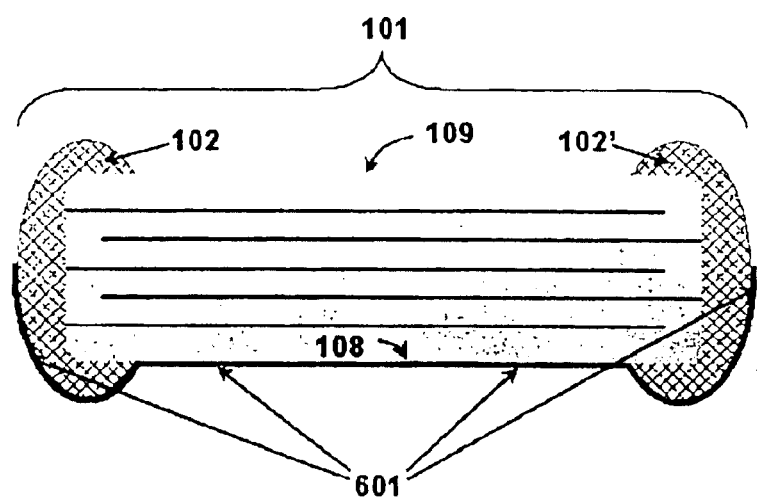
FIG. 6 is a cross-sectional view of the capacitor removed from the fluidized bed with insulative material coating the bottom surface and the terminations up to half the height of the capacitor chip.

After the capacitor chip, 101, is removed from the fluid and dried, a thin insulative coating, 601, covers the outer surface of the bottom half of the three dimensional capacitor chip, 101, as shown in FIG. 6. The bottom face, 108, of the ceramic chip, 101, is coated, but this has no consequence upon the invention. Paramount to this invention is the thin insulative coating, 601, that covers the lower portions of the terminations, 102 and 102'. By insulating the lower portions of the terminations, 102 and 102', the conductive epoxy or solder, 402, which attaches the capacitor chip, 101, to the leadframe, 401, is isolated to the top half of the capacitor chip, 101. Since the conductive epoxy or solder, 402, is concentrated to the top half of the capacitor chip, 101, and the insulative film, 601, is along the lower half of the termination, 102 or 102', the solder, 403, which attaches the leadframe, 401, to the PCB, 204, cannot wick or establish contact between the leadframe, 401, and the terminations, 102 and 102'.

Figure 7:
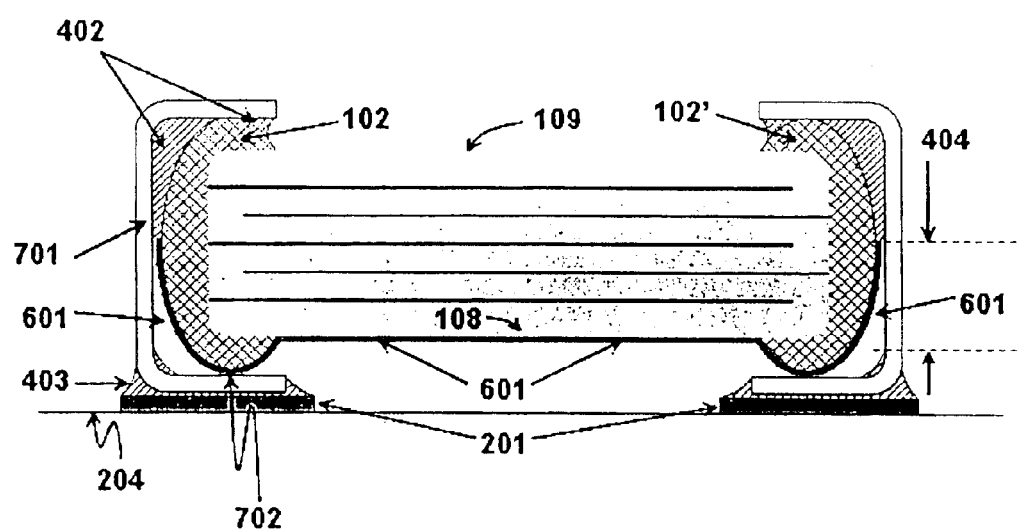
FIG. 7 is a cross-sectional view of a ceramic capacitor with a low profile leadframe attached and mounted to a PCB.
Figure 8:
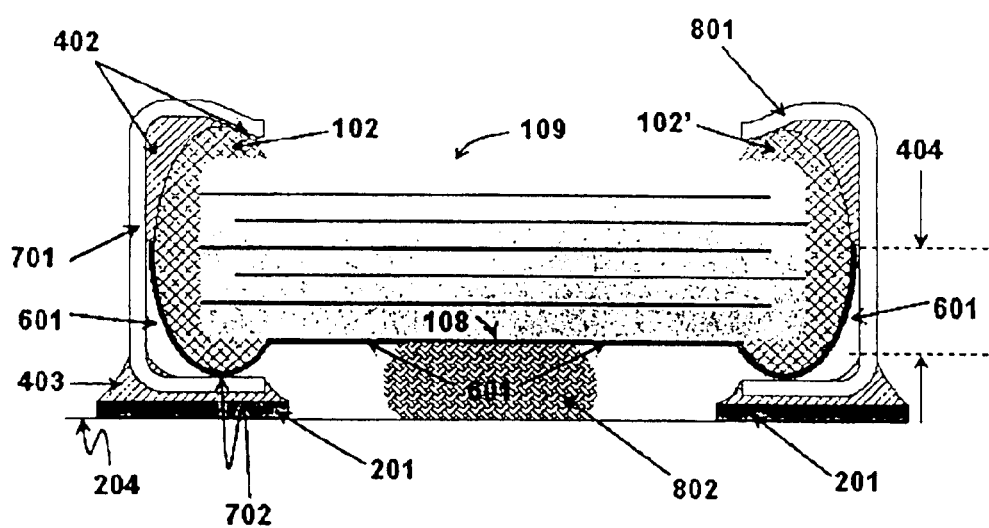
FIG. 8 is a cross-sectional view of a ceramic capacitor chip with an undercoating and a 'clip-on' low profile leadframe attached and mounted to a PCB.

A second embodiment uses a modified leadframe. FIG. 7 is a cross-sectional view of the ceramic chip capacitor, 101, pretreated with the insulative coating, 601, assembled to a leadframe, 701, and mounted to the solder pads, 201, of a PCB, 204. Unique to this presentation is that the leadframe, 701, has no additional extension of the vertical member of the leadframe, 401, of the first embodiment; however, there is a separation distance, 404, of the leadframe, 701. The separation distance, 404, allows for mechanical relief between the ceramic capacitor, 101, and the PCB, 204. The separation distance, 404, of the leadframe, 701, occurs because solder, 402, does not bond to the insulative coating, 601, which is on the lower half of the capacitor chip, 101. The foot of the leadframe, 401, is bent under the capacitor chip, 101, and may be in physical contact with the coating, 601, on the lower extremes, 702, of the end terminations, 102 and 102', of the capacitor chip, 101. Because this coating is insulative, the solder connection, 403, to the pads, 201, on the PCB, 204, has no chance of forming a mechanical bridge directly from the pads, 201, to the lower extremes, 702, of the termination ends, 102, and 102'. The increase in height for the capacitor chip, 101, from the PCB, 204, is only the thickness of the foot of the leadframe, 401, plus the coating, 601. The reduction in height of the leadframe, 401, reduces resistive, inductive, and thermal parasitics. It also reduces the mechanical instability of the device, The leadframe, 701, of FIG. 7 is shown to be extended to mechanically fit the end terminations, 102 and 102'. This would enable attachment to the capacitor chip, 101, using loose fixturing. However, since the top of the chip, 109, is the attachment region to the leadframe, 701, an upside-down fit of the capacitor chip, 101, onto the leadframe, 701, may create small variations of separation between the fold-under portion of the leadframe, 701, of the insulative coating, 601, over the end terminations, 102 and 102'. Utilizing another embodiment of the leadframe, 701, as illustrated in FIG. 8, eliminates this variation. Here, the leadframe, 701, has a bent down portion, 801, to create an undersized pocket and allow the mechanical tension of the leadframe, 701, over the capacitor chip, 101, which creates a slight pinching force during solder reflow or conductive epoxy curing, to assure the spacing between the insulative coating, 601, and the fold-under leadframe, 701, is the same.

In FIG. 8, an undercoating, 802, is shown between the bottom face of the capacitor chip, 101, coated with the insulative coating, 601, and the PCB, 204, to help secure the mass of the device and reduce mechanical instability. The undercoating, 802, is an adhesive that has some elasticity to cushion any mechanical force along the bottom face, 108, of the ceramic capacitor chip, 101, which would tend to lead to cracking the insulative coating, 601. The undercoating, 802, is optional and will only add to the mechanical stability of the mounted capacitor chip, 101.

What is claimed is:

1. A ceramic capacitor comprising:
   a multiplicity of parallel plates in planar relationship wherein each plate terminates at an opposing faces in an alternating pattern;
   a dielectric between said parallel plates;
   two external terminations on opposing sides of said capacitor wherein a first external termination is in electrical contact with alternating plates of said multiplicity of parallel plates and a second external termination is in electrical contact with separate alternating plates than said first external termination;
   an insulator covering a portion of said two external terminations;
   a first low-profile lead terminal in electrical contact with said first external termination at a location void of said insulator; and
   a second low-profile lead terminal in electrical contact with said second external termination at a location void of said insulator.

2. The ceramic capacitor of claim 1 wherein said insulation is between said first external termination and a first foot of said first low-profile lead and between said second external termination and a second foot of said second low-profile lead.

3. The ceramic capacitor of claim 2 wherein said insulator is in contact with said first external termination and said first foot.

4. The ceramic capacitor of claim 1 wherein said insulator covers at least one fourth of the surface of said external leads.

5. The ceramic capacitor of claim 4 wherein said insulator covers at least one half of the surface of said external leads.

6. The ceramic capacitor of claim 5 wherein said low-profile lead frame is in electrical contact with a top of said external lead.

7. A printed circuit board further comprising a capacitor of claim 1.

8. The printed circuit board of claim 7 wherein said capacitor is attached to said printed circuit board by a solder strip.

\* \* \* \* \*